United States Patent
Hsuan et al.

(10) Patent No.: US 6,252,300 B1
(45) Date of Patent: Jun. 26, 2001

(54) DIRECT CONTACT THROUGH HOLE TYPE WAFER STRUCTURE

(75) Inventors: Min-Chih Hsuan, Hsinchu; Charlie Han, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/260,218

(22) Filed: Mar. 1, 1999

(30) Foreign Application Priority Data

Jan. 14, 1999 (TW) .................................. 88100499

(51) Int. Cl.[7] .......................... H01L 23/02; H01L 23/48; H01L 23/52; H01L 29/40

(52) U.S. Cl. ............................................. 257/686; 257/777
(58) Field of Search ..................................... 257/686, 777; 438/104, FOR 368, FOR 426

(56) References Cited

U.S. PATENT DOCUMENTS 5,426,072 * 6/1995 Finnila .
5,587,341 * 12/1996 Masayuki et al. .
6,080,264 * 6/1995 Ball .

* cited by examiner

*Primary Examiner*—David E. Graybill

(57) ABSTRACT

A direct contact through hole type wafer structure. Both sides of a wafer have devices and contacts. The contacts are coupled with the devices. Bumps are formed on the contacts, respectively.

12 Claims, 10 Drawing Sheets

DIRECT CONTACT THROUGH HOLE TYPE WAFER STRUCTURE

BACKGROUND OF THE INVENTION

1. Field of the Invention

The present invention relates to a wafer structure. More particularly, the present invention relates to a direct contact through hole type wafer structure.

2. Description of the Related Art

A trend for electrical products is to be light, short, small and thin. Not only the chips manufacturing technology but also the packaging, technology is developed rapidly to meet the trend. Since a width of a chip is reduced quickly, an integration of the chip is increased and a volume of a chip is decreased. As a result, it is an important task to develop a new packaging technology, which is able to form a small volume package.

Memory modules, for example, are the common semiconductor products. The memory modules are generally formed by the following steps. Chips are first packaged, and then the packages are attached to a printed circuit board. The steps of forming the memory modules are complicated and manufacturing costs are high. Additionally, the arrangement of the packages on the printed circuit board is two-dimensional. An area occupied by the packages is large, so that the packaging density is low. To further reduce reduction of a size of the memory module is limited.

A stacked-type package structure is designed to overcome the above problems. The package structure is three-dimensional, thus an area occupied by packages is reduced and the packaging density is increased.

FIG. 1 is a schematic, cross-sectional diagram of a conventional stacked-type package structure.

Referring to FIG. 1, chips 10a, 10b and 10c are coupled with leadframes 14a, 14b and 14c by bonding wires 12, respectively. The chips 10a, 10b, 10c and the leadframes 14a, 14b, 14c are sealed by epoxy 16 to form packages 18a, 18b and 18c. The packages 18a, 18b, 18c are stacked and coupled with each other by outer leads of the leadframes 14a, 14b, 14c. Outer leads of the leadframe 14c couple with contacts 22 on a printed circuit board 20 by tape automatic bonding.

Although the stacked-type package structure reduces the area occupied by the packages, a height of the stacked-type package structure is high. Furthermore, a signal-transmitting path from the stacked-type package structure to the printed circuit board is long, so that electrical impedance is increased. As a result, signals transmitted decay and are delayed.

SUMMARY OF THE INVENTION

Accordingly, the present invention provides a direct contact through hole type wafer structure that has contacts on both sides.

The invention provides a direct contact through hole type wafer structure that is used to form a wafer-level package, so that a volume and a height of the package are reduced.

The invention provides a direct contact through hole type wafer structure used to form a package, so that a signal transmitting path and electrical impedance of the package are reduced.

To achieve these and other advantages and in accordance with the purpose of the invention, as embodied and broadly described herein, the invention provides a three-dimensional stacked-type package structure. Both sides of a wafer have devices and contacts. The contacts are coupled with the devices. Bumps are formed on the contacts, respectively.

Because a package structure provided according to the invention is a wafer-level package, a volume and a height of the package are reduced. Additionally, the signal-transmitting path is reduced. The electrical impedance is also reduced, so that the problem of signals delayed and decayed is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
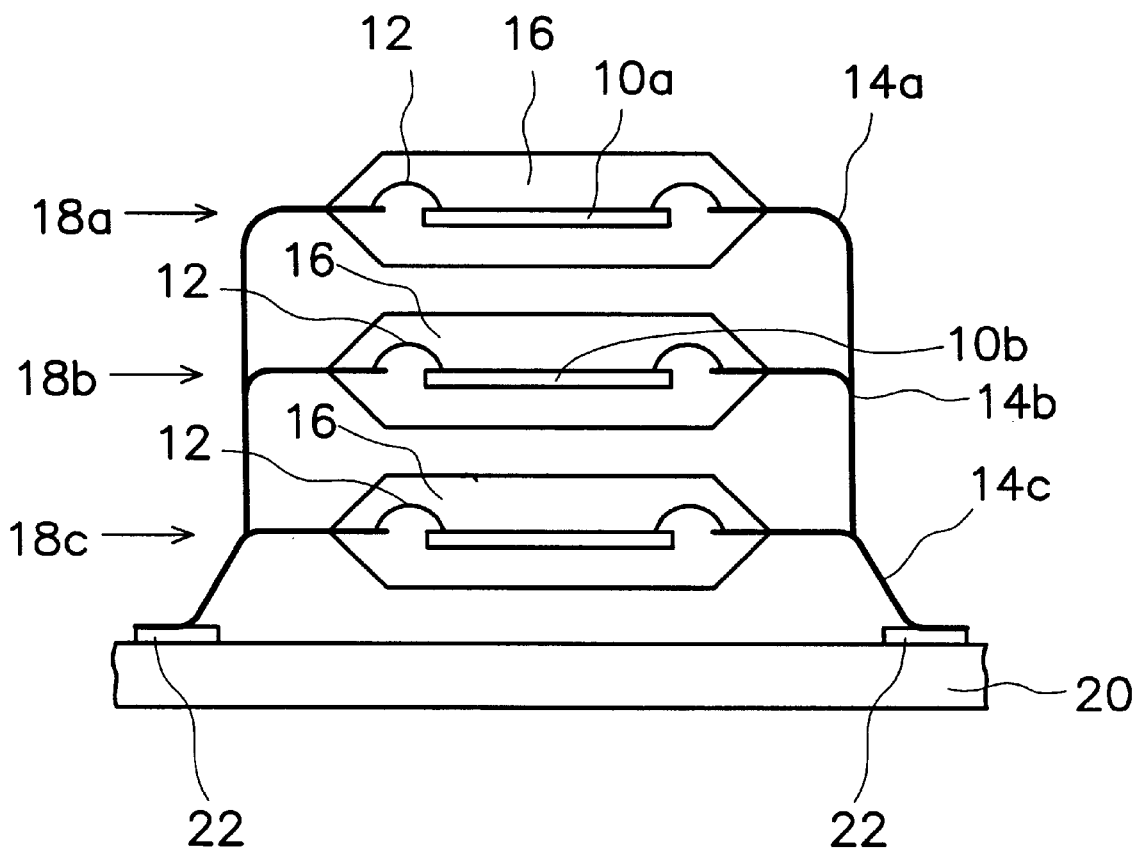
FIG. 1 is a schematic, cross-sectional diagram of a conventional tape automatic bonding package structure.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic, cross-sectional diagrams of fabricating a three-dimensional stacked-type package structure according to the invention.

Figure 2A:
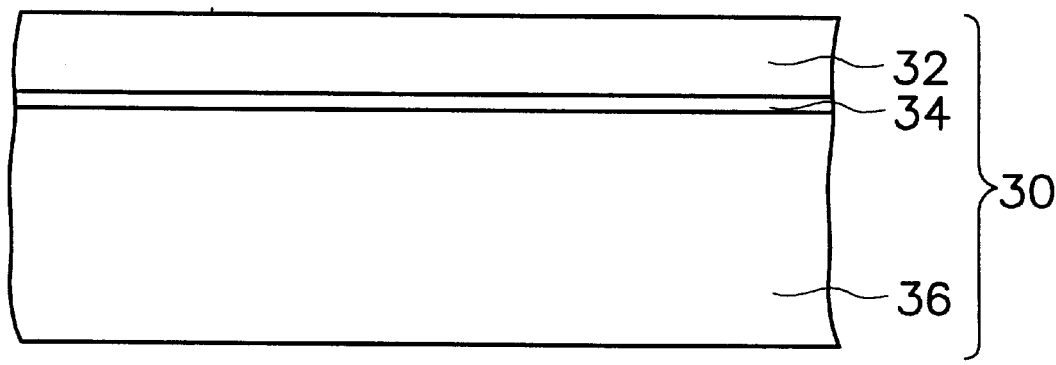
FIGS. 2A through 2H are schematic, cross-sectional diagrams of fabricating a three-dimensional stacked-type package structure according to the invention.

As shown in FIG. 2A, a silicon-on-insulator (SOI) substrate 30 is preferred in the invention. The silicon-on-insulator substrate 30 is made from an insulation layer 34 and silicon substrates 32 and 36. The insulation layer 34 is located between the silicon substrates 32 and 36.

There are three methods generally used to form the silicon-on-insulator substrate 30.

In the first method, an ion implantation process and a thermal process are performed in sequence to form a silicon dioxide layer in a silicon substrate. The depth of the silicon dioxide layer is about 2 to 3 $\mu$m.

In the second method, a silicon dioxide layer is formed on a silicon substrate. Another silicon substrate is adhered to the silicon dioxide layer.

In the third method, a silicon dioxide layer is formed on a silicon substrate. A silicon layer is formed on the silicon dioxide layer by epitaxy.

Figure 2B:
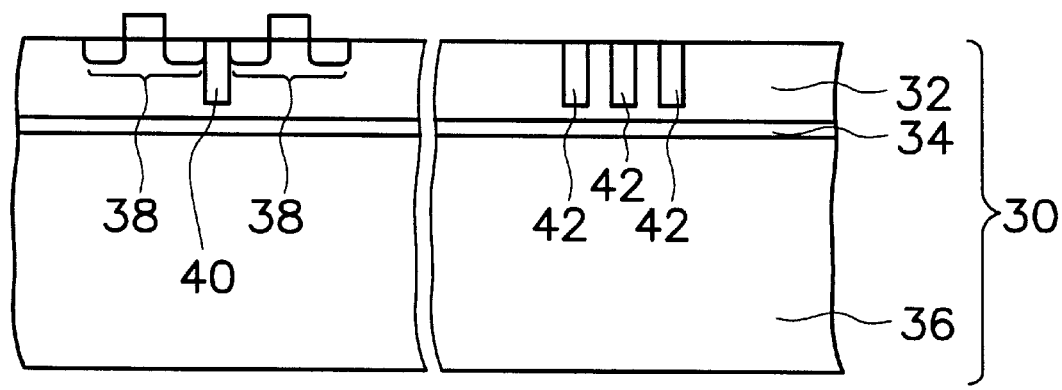

Referring to FIG. 2B, metal-oxide-semiconductor (MOS) transistors 38 and an insulation structure 40 such as shallow trench isolation are formed in the silicon substrate 32.

Additionally, devices (not shown), for example, resistors, capacitors, inductors, diodes and bipolar junction transistors (BJT) are formed in the silicon substrate 32. A plurality of contact plugs 42 is also formed in the silicon substrate 32. The material used to form the contact plugs 42 is selected from a group consisting of tungsten, copper, and aluminum.

Figure 2C:
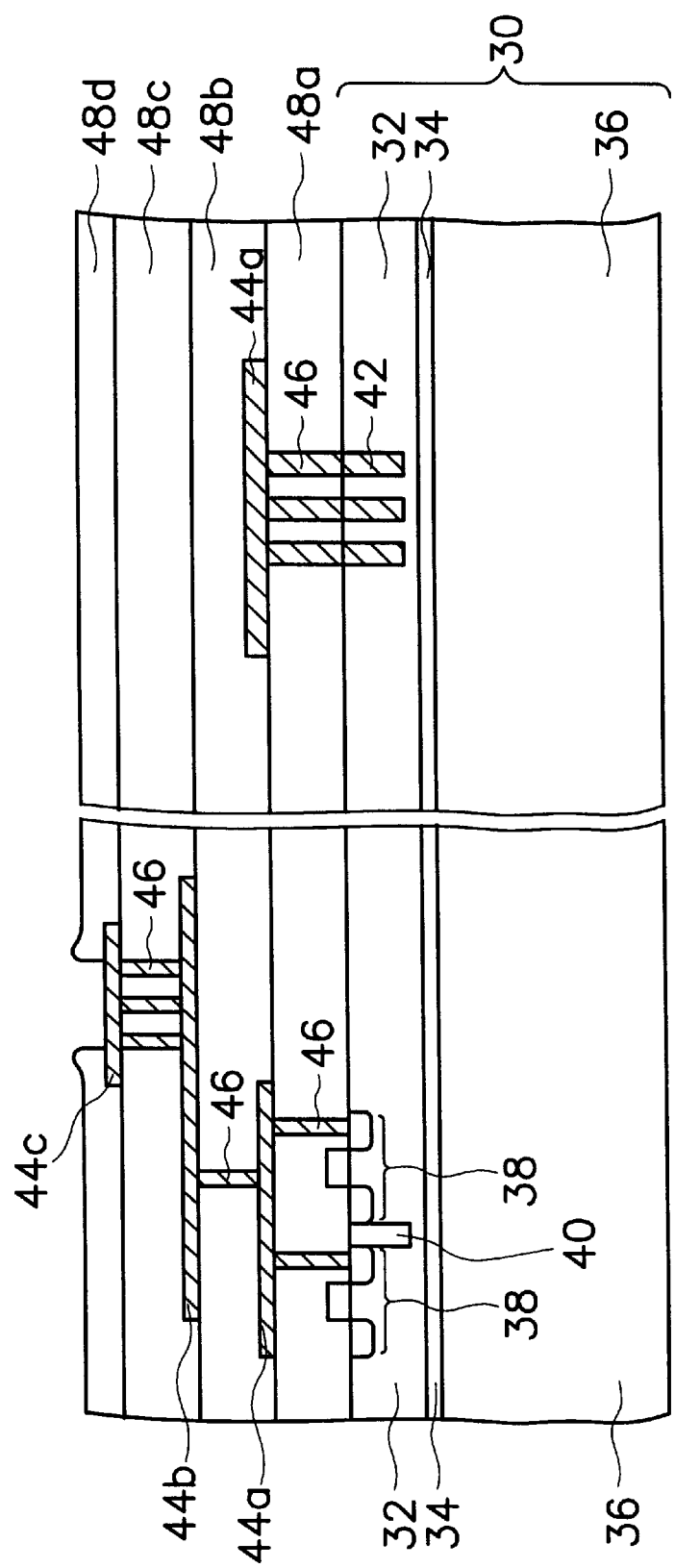

Referring to FIG. 2C, steps of forming multilevel interconnects are performed. The technique of forming multilevel interconnects is not directly related to the invention and is well known to those skilled in the art, so that detailed description is omitted herein. As a result, insulation layers 48a, 48b, 48c, 48d and patterned conductive layers 44a, 44b, 44c are formed over the silicon substrate 32. Furthermore, plugs 46 are formed in the insulation layers 48a, 48b and 48c. The conductive layer 44c is used as a bonding pad. It is also suitable to form a plurality of bonding pads on the conductive layer 44c. The insulation layer 48d is formed on the conductive layer 44c as a passivation layer and exposes a portion of the conductive layer 44c. The conductive layers 44a, 44b and 44c include aluminum, doped polysilicon, tungsten or copper, and the step of forming the conductive layer 44a, 44b and 44c includes sputtering or chemical vapor deposition. The material used to form the insulation layers 48a, 48b, 48c and 48d is selected from a group consisting of silicon dioxide, silicon nitride, spin-on-glass (SOG) and borophosphosilicate glass (BPSG). The plugs 46 include tungsten, aluminum or copper.

Figure 2D:
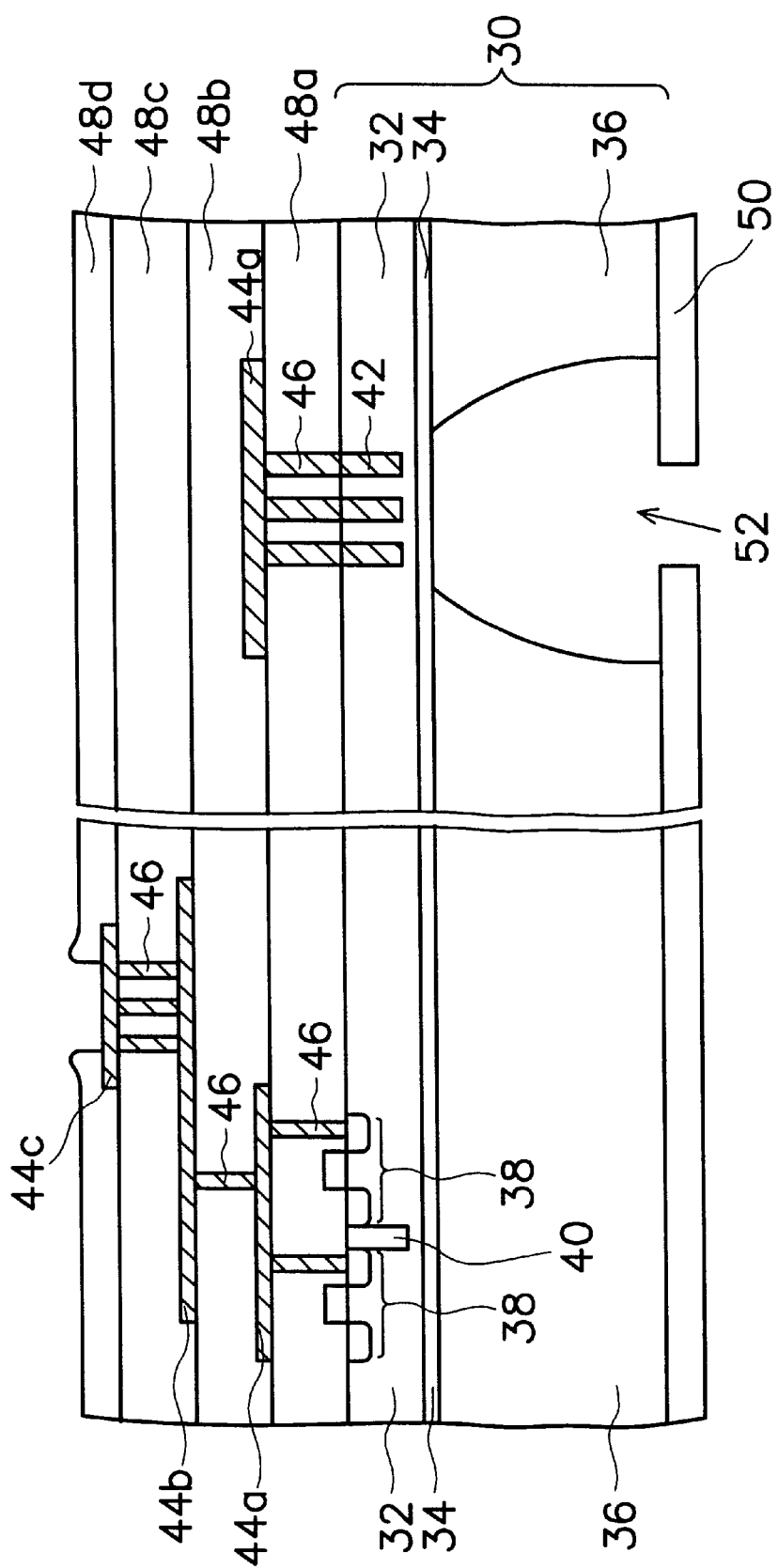

Referring to FIG. 2D, a patterned photoresist layer 50 is formed on the silicon substrate 36. A portion of the silicon substrate 36 is removed by using the insulation layer 34 as a stop layer to form an opening 52 and the opening 52 is aligned with the contact plugs 42. The step of removing the silicon substrate 36 includes wet etching or electrochemical etching.

Figure 2E:
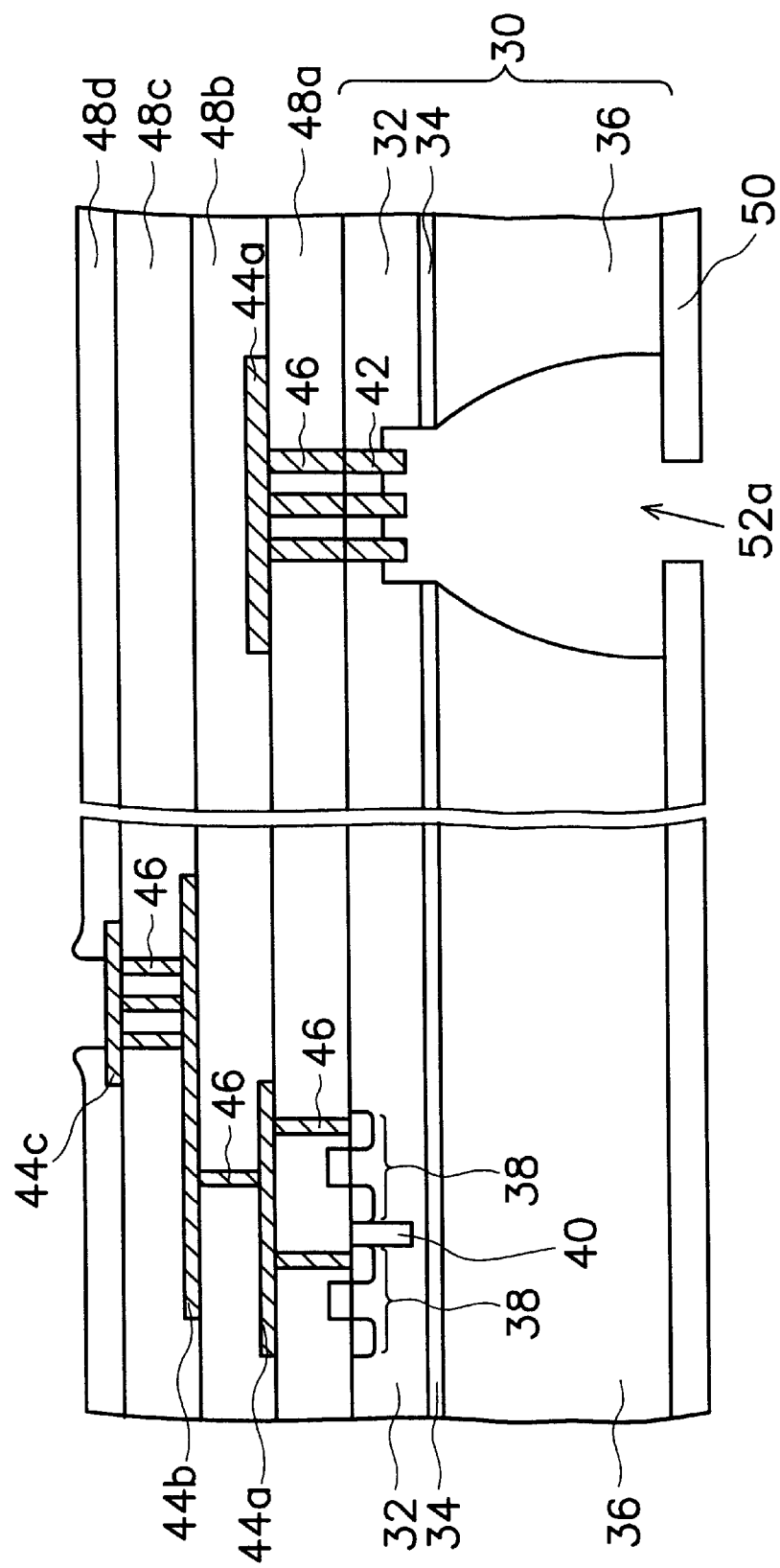

Referring to FIG. 2E, a portion of the insulation layer 34 and a portion of the silicon substrate 32 are removed by using the photoresist layer 50 as a mask to form an opening 52a. The step of removing the silicon substrate 32 and the insulation layer 34 is preferably dry etching. The contact plugs 42 are exposed by the opening 52a. Then, the photoresist layer 50 is removed.

The steps illustrated in FIGS. 2D and 2E are like a micro machining process. The purpose of the above two steps is to expose the contact plugs 42 in the opening 52a. As a result, the contact plugs 42 can serve as contacts on the silicon-on-insulator substrate 30.

Figure 2F:
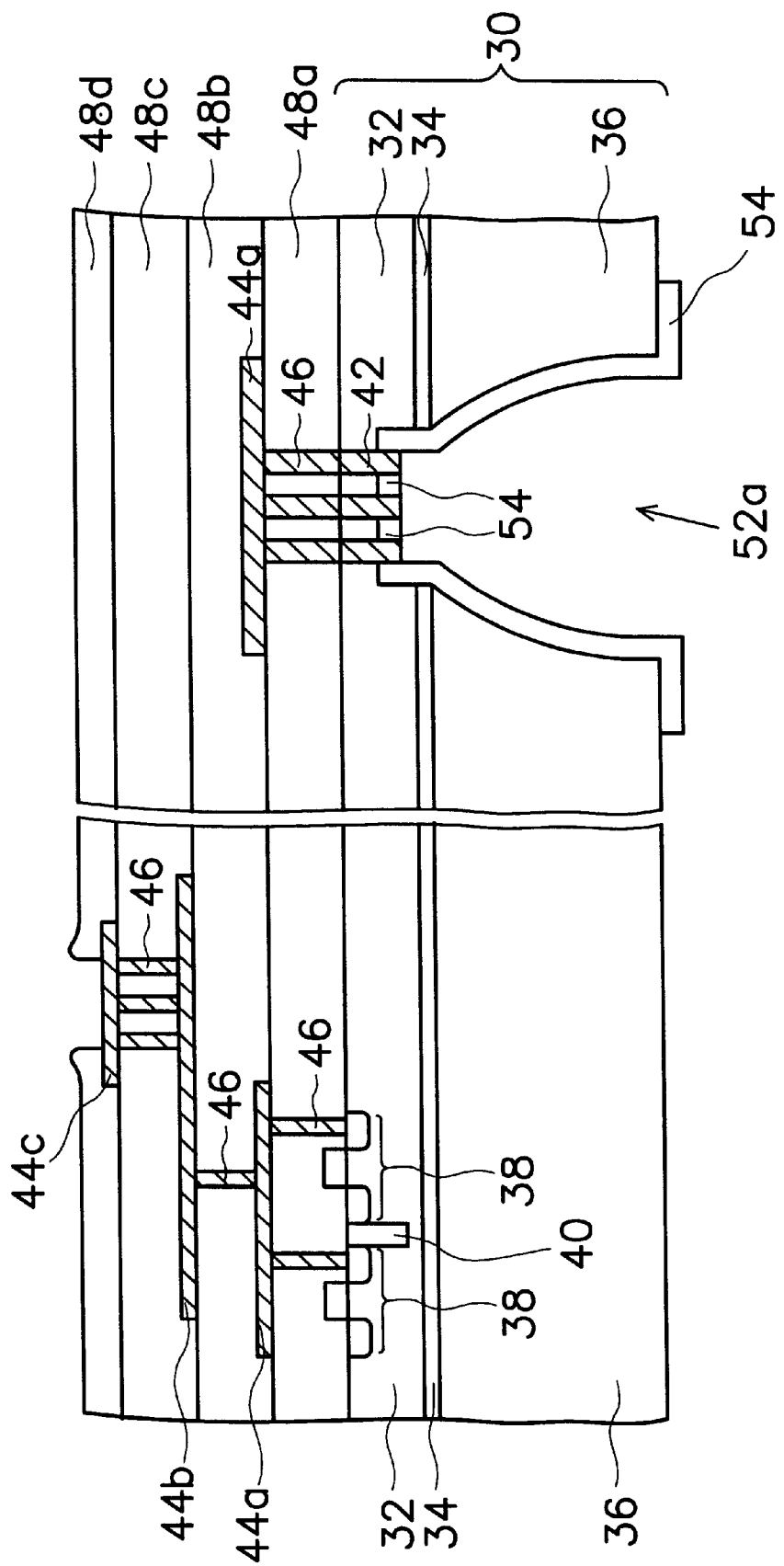

Referring to FIG. 2F, an insulation layer 54 is formed in the opening 52a and along the exposed silicon substrate 32 and 36. Additionally, the contact plugs 42 are exposed. The step of forming the insulation layer 54 includes thermal oxidation or deposition. The purpose of the insulation layer 54 is to isolate the contact plugs 42 from the silicon substrate 32.

Figure 2G:
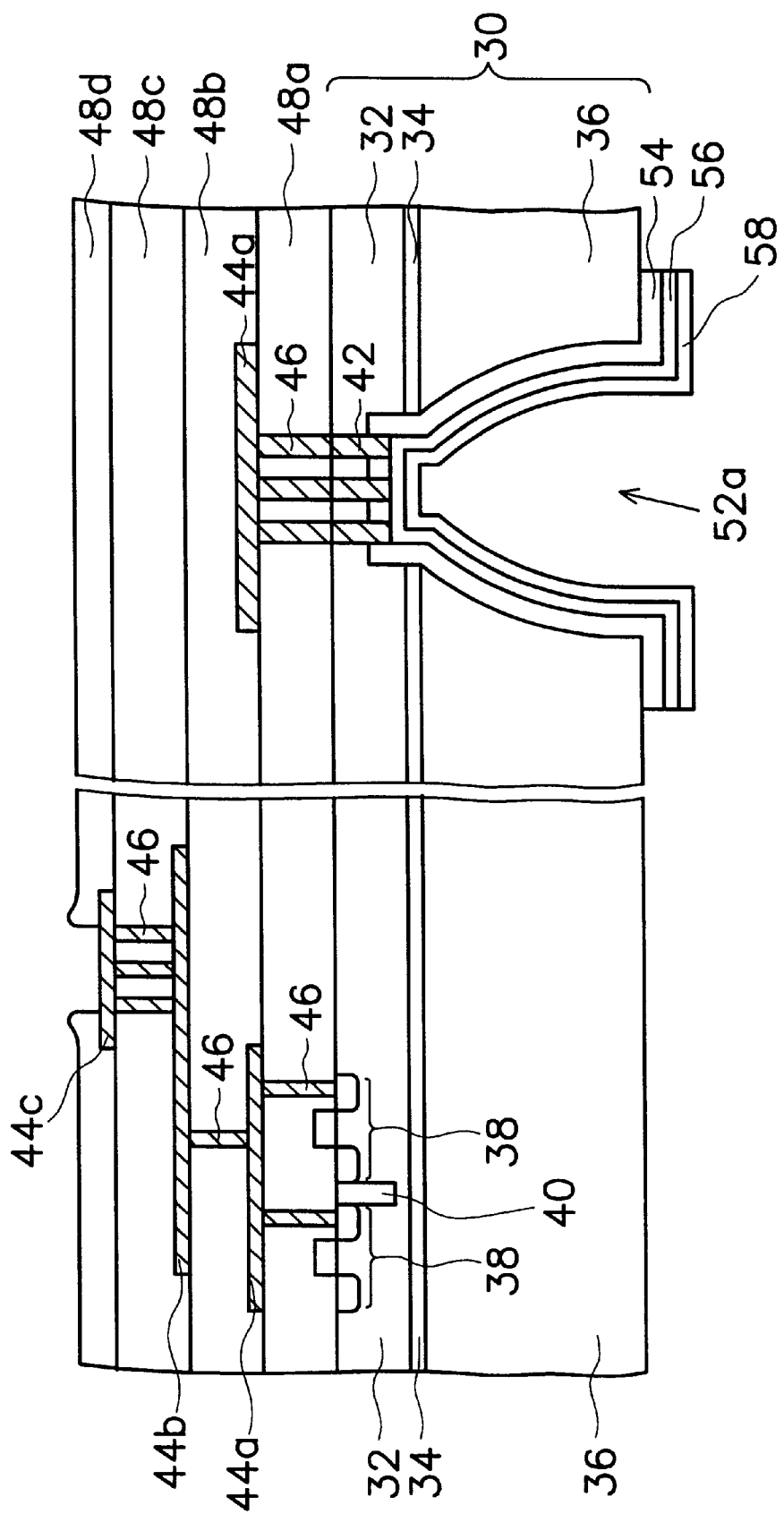

Referring to FIG. 2G, a barrier layer 56 and a metal layer 58 are formed in sequence on the insulation layer 54. The purpose of the barrier layer 56 is to prevent ions in subsequently formed thin films from penetrating into the silicon-on-insulator 30 and affecting the devices in the silicon-on-insulator 30. The material used to form the barrier layer 56 is selected from a group consisting of titanium, titanium nitride, titanium/tungsten alloy, chromium and a combination thereof. The purpose of the metal layer 58 is to improve the adhesion between the barrier layer 56 and a subsequently formed bump. The material used to form the metal layer 58 is selected from a group consisting of nickel, tungsten, gold, palladium and a combination thereof.

Figure 2H:
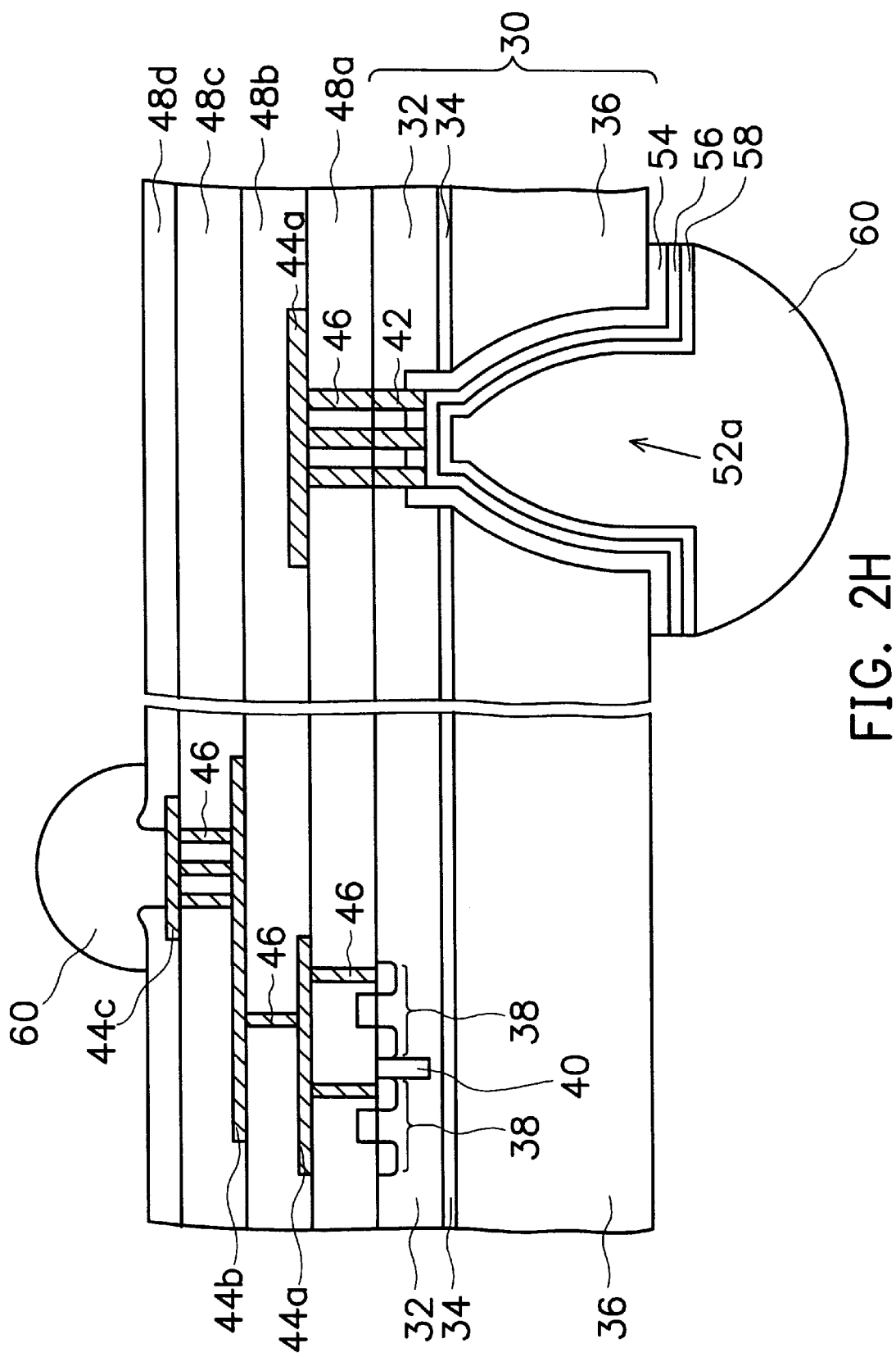

Referring to FIG. 2H, bumps 60 are formed on the metal layer 58 and the conductive layer 44c. Furthermore, a barrier layer (not shown) and a metal layer (not shown) can also be formed on the conductive layer 44c before forming the bumps 60 to improve the reliability. The material used to form the bumps 60 is selected from a group consisting of gold, tin and lead/tin alloy, whose ratio is about 95 to 5. The bumps 60 are coupled with the devices in the silicon-on-insulator 30 by the contact plugs 42, the conductive layer 44a, 44b, 44c and the plugs 46.

In the invention, the contact plugs 42 are exposed in the opening 52a, so that a direct contact through hole (DCTH) type wafer is fabricated and both sides of the silicon-on-insulator 30 have contacts. The contact plugs 42 are arranged as an array, thus a plurality of the contact plugs 42 are coupled with a bump 60. Furthermore, a bump 60 formed to cover a plurality of the opening 52a is also acceptable.

Figure 2I:
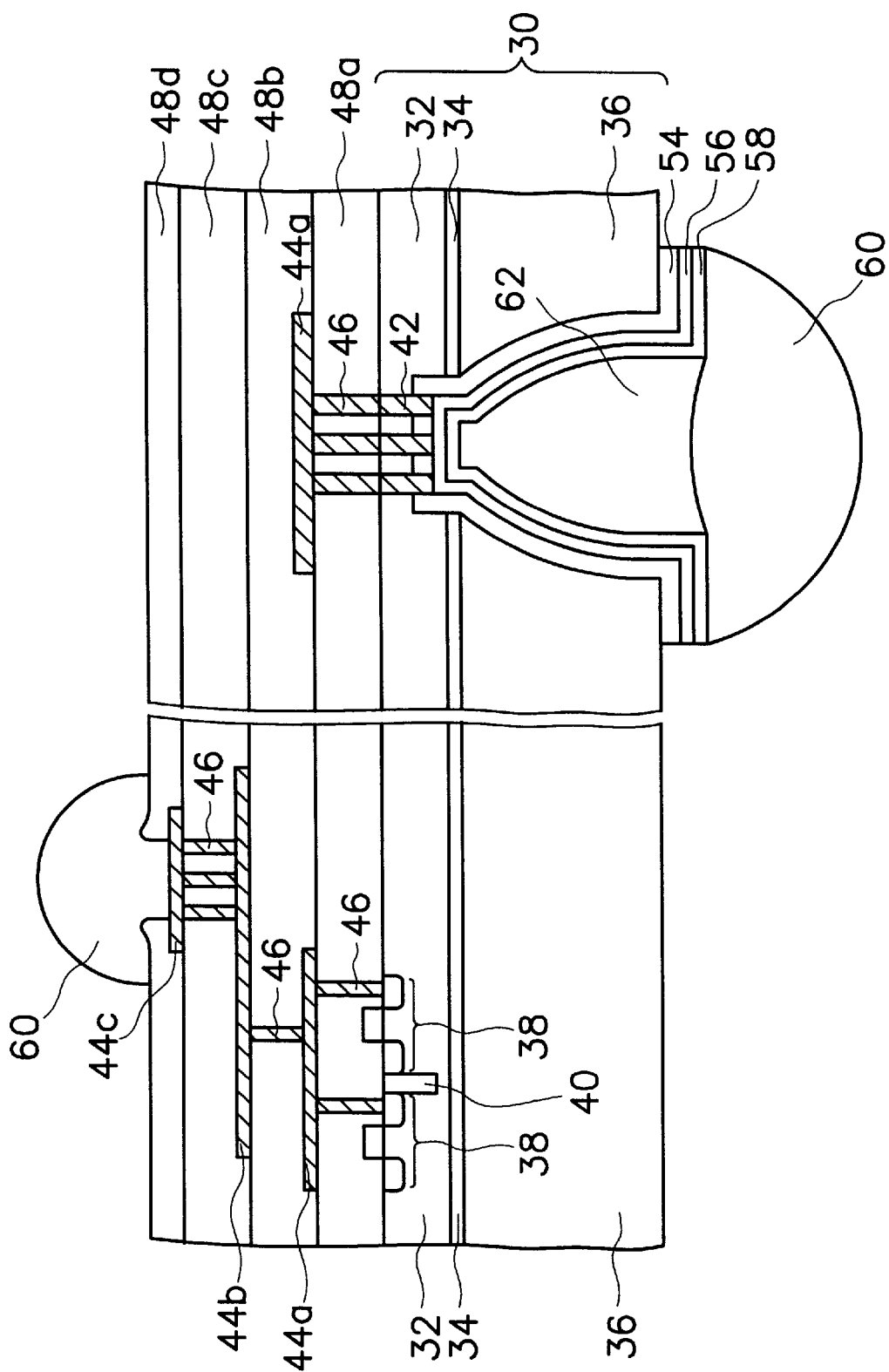
FIG. 2I is a schematic, cross-sectional diagram of another three-dimensional stacked-type package structure according to the invention.

FIG. 2I is a schematic, cross-sectional diagram of another three-dimensional stacked-type package structure according to the invention.

Referring to FIG. 2I, a conductive material 62 fills the opening 52a to reduce stresses. Then, the bump 60 is formed on the conductive material 62. The conductive material 62 includes conductive silicone or conductive epoxy.

Figure 3:
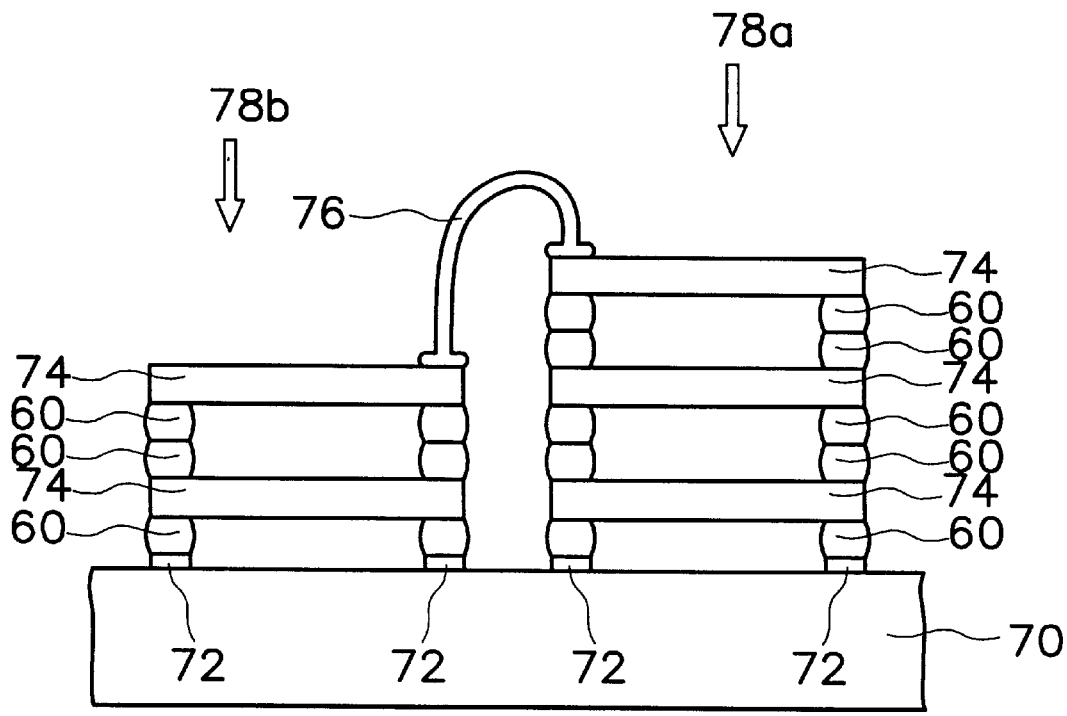
FIG. 3 is a schematic, cross-sectional diagram showing packages formed according to the invention.

FIG. 3 is a schematic, cross-sectional diagram showing packages formed according to the invention.

Referring to FIG. 3, chips 74 formed according to the invention have bumps 60 on both sides of the chips 74. Each chip 74 couples with other chips 74 or contacts 72 on a printed circuit board 70 by the bumps 60. In FIG. 3, a stack 78a formed by three chips 74 is shown on the right-hand side and a stack 78b formed by two chips 74 is shown on the left-hand side. The stacks 78a and 78b are coupled by a bonding wire 76. The step of coupling the stacks 78a and 78b includes wire bonding or tape automatic bonding.

Figure 4:
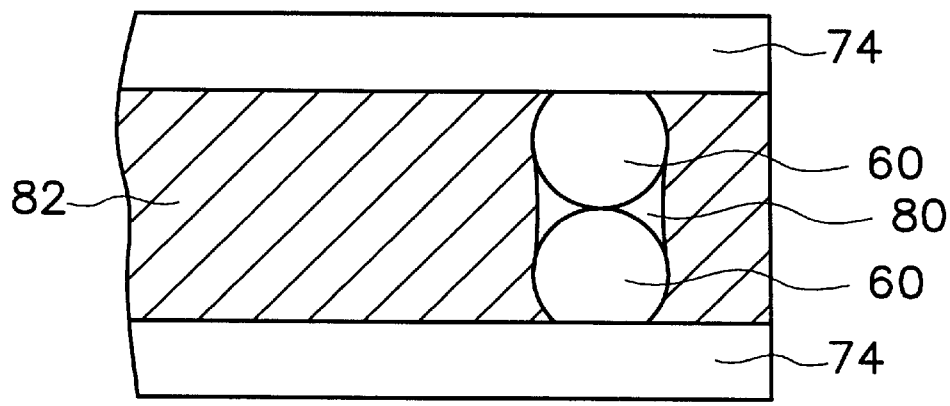
FIG. 4 is a schematic, cross-sectional diagram showing an adhesion part of bumps.

FIG. 4 is a schematic, cross-sectional diagram showing an adhesion part of bumps.

Referring to FIG. 4, the bump 60 on the chip 74 is made from a substantially high melting point material. A substantially low melting point material 80 such as lead/tin alloy, whose ratio is about 63 to 37, is used as a solder when the chip 74 adheres to another chip 74. Anisotropic conductive film (ACF) or anisotropic conductive paste (ACP) is also suitable for the solder. In order to avoid a stress generated by heat during the operation, which usually breaks the adhesion between the bumps 60, an underfill 82 is filled between chips 74, and the chip 74 and the printed circuit board 70 (FIG. 3). Since the chip 74 is directly attached to the printed circuit board 70 (FIG. 3), no carrier is used. The package according to the invention is a wafer-level package, so that a volume and a height of the package are reduced.

In the embodiment, one bump is formed over an opening. However, a bump formed over a plurality of openings is acceptable. The process is similar to the one mentioned above, so that the detailed description is omitted herein.

According to the foregoing, the advantages of the invention include the following:

1. A wafer fabricated according to the invention is a direct contact through hole type wafer, so that both sides of the wafer have contacts. As a result, chips according to the invention are easily stacked. Especially, the chips are stacked three-dimensionally.

2. A package according to the invention is a wafer-level package and stacked three-dimensionally, so that the volume and the height of the package are decreased.

3. Because chips are coupled with other chips or the printed circuit board by the bumps, the signal transmitting path is reduced. As a result, electrical impedance is reduced. The problem of the signals delaying and decaying is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A direct contact through hole type wafer structure, comprising:

a silicon-on-insulator substrate having a first silicon substrate, a second silicon substrate and a first insulation layer with the first insulation layer positioned between the first and second silicon substrates, wherein at least one opening is formed in the second silicon substrate and penetrates into the first silicon substrate through the first insulation layer;

at least one device positioned on the first silicon substrate;

a plurality of contact plugs positioned in the first silicon substrate and exposed by the opening;

a plurality of dielectric layers and a plurality of patterned conductive layers which couples with the device and the contact plugs and a plurality of plugs in the dielectric layers, and the dielectric layers and the patterned conductive layers being alternately stacked on the first silicon substrate, wherein at least one bonding pad is formed on an uppermost conductive layer and exposed by an uppermost dielectric layer formed on the uppermost conductive layer;

a second insulation layer positioned in the opening, wherein the second insulation layer is along a surface of the opening and exposes the contact plugs;

a barrier layer positioned on the second insulation layer and coupled with the contact plugs; and a metal layer positioned on the barrier layer.

2. The structure of claim 1, wherein bumps are positioned on the metal layer and the bonding pad, respectively.

3. The structure of claim 2, wherein a conductive material is positioned between the bumps and the metal layer.

4. The structure of claim 3, wherein the conductive material includes conductive epoxy.

5. The structure of claim 3, wherein the conductive material includes conductive silicone.

6. The structure of claim 1, wherein the second insulation layer includes silicon dioxide.

7. The structure of claim 1, wherein a material used to form the barrier layer is selected from a group consisting of titanium, titanium nitride, titanium/tungsten alloy, chromium and a combination thereof.

8. The structure of claim 1, wherein a material used to form the metal layer is selected from a group consisting of nickel, tungsten, gold, palladium and a combination thereof.

9. The structure of claim 1, wherein the bump includes gold.

10. The structure of claim 1, wherein the bump includes lead/tin alloy.

11. The structure of claim 1, wherein the bump includes tin.

12. The structure of claim 1, wherein an arrangement of the contact plugs in the opening is an array.

* * * * *